US009653343B1

(12) United States Patent
Chang et al.

(10) Patent No.: US 9,653,343 B1
(45) Date of Patent: May 16, 2017

(54) METHOD OF MANUFACTURING SEMICONDUCTOR DEVICE WITH SHALLOW TRENCH ISOLATION (STI) HAVING EDGE PROFILE

(71) Applicant: UNITED MICROELECTRONICS CORP., Hsin-Chu (TW)

(72) Inventors: Kai-Kuen Chang, Keelung (TW); Shih-Yin Hsiao, Chiayi County (TW); Chang-Po Hsiung, Hsinchu (TW)

(73) Assignee: UNITED MOCIROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/172,136

(22) Filed: Jun. 2, 2016

(30) Foreign Application Priority Data

May 4, 2016 (TW) .............................. 105113789 A

(51) Int. Cl.
*H01L 21/762* (2006.01)
*H01L 21/8234* (2006.01)
*H01L 29/06* (2006.01)
*H01L 29/423* (2006.01)
*H01L 29/08* (2006.01)
*H01L 27/088* (2006.01)

(52) U.S. Cl.
CPC .............. *H01L 21/76235* (2013.01); *H01L 21/823418* (2013.01); *H01L 21/823462* (2013.01); *H01L 21/823481* (2013.01); *H01L 27/088* (2013.01); *H01L 29/0653* (2013.01); *H01L 29/0847* (2013.01); *H01L 29/42364* (2013.01)

(58) Field of Classification Search
CPC ..... H01L 21/823878; H01L 21/823481; H01L 21/76235; H01L 21/823462
See application file for complete search history.

(56) References Cited

U.S. PATENT DOCUMENTS

| 6,274,498 | B1 * | 8/2001 | Moore | H01L 21/76235 257/E21.244 |
| 6,368,941 | B1 * | 4/2002 | Chen | H01L 21/76235 257/510 |
| 6,566,224 | B1 * | 5/2003 | Chang | H01L 21/76235 257/E21.55 |
| 6,740,944 | B1 | 5/2004 | McElheny et al. | |
| 6,825,544 | B1 * | 11/2004 | Jin | H01L 21/76235 257/499 |
| 6,951,792 | B1 | 10/2005 | McElheny | |
| 6,972,241 | B2 * | 12/2005 | Chiu | H01L 21/76232 257/E21.549 |
| 7,052,960 | B2 | 5/2006 | Yang | |
| 7,915,173 | B2 * | 3/2011 | Jeng | H01L 21/76235 257/626 |
| 2002/0020887 | A1 * | 2/2002 | Lee | H01L 21/76235 257/374 |

(Continued)

*Primary Examiner* — Evan Pert
(74) *Attorney, Agent, or Firm* — Winston Hsu; Scott Margo

(57) ABSTRACT

A method for fabricating semiconductor device is disclosed. First, a substrate having a first region and a second region is provided, a shallow trench isolation (STI) is formed in the substrate to separate the first region and the second region, and a patterned hard mask is formed on the first region and part of the STI, in which the patterned hard mask exposes includes an opening to expose part of the STI. Next, a gas is driven-in through the exposed STI to alter an edge of the substrate on the first region.

10 Claims, 8 Drawing Sheets

(56) References Cited

U.S. PATENT DOCUMENTS

| | | | |
|---|---|---|---|
| 2004/0147090 A1* | 7/2004 | Kim | H01L 21/76232 438/424 |
| 2005/0003679 A1* | 1/2005 | Hyun | H01L 21/02238 438/770 |
| 2006/0148197 A1* | 7/2006 | Wu | H01L 21/76232 438/424 |
| 2006/0148201 A1* | 7/2006 | Kim | H01L 21/76232 438/424 |
| 2007/0141852 A1* | 6/2007 | Stapelmann | H01L 21/3105 438/758 |
| 2007/0155128 A1* | 7/2007 | Choi | H01L 21/76224 438/424 |
| 2007/0287260 A1* | 12/2007 | Wu | H01L 21/76232 438/400 |
| 2009/0065879 A1 | 3/2009 | Ma | |
| 2012/0168868 A1* | 7/2012 | Chiu | H01L 21/823412 257/365 |
| 2013/0154014 A1* | 6/2013 | Park | H01L 21/76202 257/368 |

* cited by examiner

METHOD OF MANUFACTURING SEMICONDUCTOR DEVICE WITH SHALLOW TRENCH ISOLATION (STI) HAVING EDGE PROFILE

BACKGROUND OF THE INVENTION

1. Field of the Invention

The invention relates to a method for fabricating semiconductor device, and more particularly, to a method of altering an edge profile of a substrate.

2. Description of the Prior Art

In semiconductor processes, in order to provide good electrical isolation and to prevent short-circuits between electric devices on a wafer, a localized oxidation isolation (LOCOS) process, or a shallow trench isolation (STI) process is used to insulate and protect devices. Since the field oxide layer of the LOCOS process consumes a large area on the wafer, and since bird's beaks can occur when growing the field oxide, an STI process is typically used in the semiconductor processes when the line width is below 0.25 µm.

An STI process involves first forming a shallow trench between each device, and then filling the trench with an insulating material to obtain an electrical isolation effect between each device. In modern processes, an oxide will be formed on the side of the trench before the isolating material is filled into the trench, in order to further insulate the isolating material from the surface of the recess. However, as size scales down, the inverse narrow width effect (INWE) becomes more important, leading performances of the semiconductor components to degrade seriously, in which the inverse narrow width effect (INWE) is the effect of the threshold voltage of a transistor reducing as the channel width of the transistor reduces.

SUMMARY OF THE INVENTION

According to a preferred embodiment of the present invention, a method for fabricating semiconductor device is disclosed. First, a substrate having a first region and a second region is provided, a shallow trench isolation (STI) is formed in the substrate to separate the first region and the second region, and a patterned hard mask is formed on the first region and part of the STI, in which the patterned hard mask exposes includes an opening to expose part of the STI. Next, a gas is driven-in through the exposed STI to alter an edge of the substrate on the first region.

According to another aspect of the present invention, a semiconductor device is disclosed. The semiconductor device includes: a substrate; a gate structure on the substrate; and a shallow trench isolation (STI) in the substrate and around the gate structure, in which an edge of the substrate contacting the STI comprises a curve profile.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
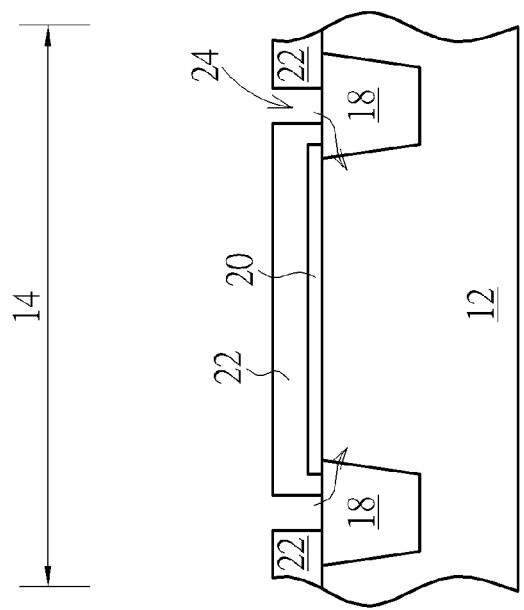
FIGS. 1-5 illustrate a method for fabricating a semiconductor device according to a preferred embodiment of the present invention.
Figure 1:
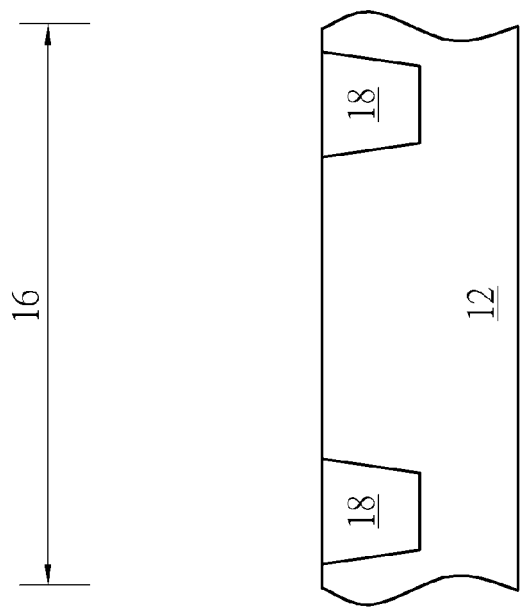

Referring to FIGS. 1-5, FIGS. 1-5 illustrate a method for fabricating a semiconductor device according to a preferred embodiment of the present invention. As shown in FIG. 1, a substrate 12, such as a silicon substrate or silicon-on-insulator (SOI) substrate is provided. A first region 14 and a second region 16 are defined on the substrate 12, and a shallow trench isolation (STI) 18 composed of silicon dioxide is formed in the substrate 12 to divide the first region 14 and the second region 16. In this embodiment, the first region 14 is preferably used to fabricate a mid-voltage semiconductor device hence the region could be referred to as a mid-voltage (MV) region. The second region 16 on the other hand is used to fabricate a high-voltage (HV) semiconductor device and therefore is referred to as a high-voltage region.

Next, a pad layer 20 and a patterned hard mask 22 are formed on the first region 14 of the substrate 12 and the STI 18, in which the pad layer 20 is only disposed on the surface of the substrate 12 on first region 14, the patterned hard mask 22 is disposed on both the substrate 12 and the STI 18 surface, and the patterned hard mask 22 preferably includes an opening 24 to expose part of the STI 18 surface. In this embodiment, the pad layer 20 is preferably composed of silicon dioxide and the patterned hard mask 22 is composed of silicon nitride. However, it would also desirable to choose other dielectric materials for the pad layer 20 and patterned hard mask 22, which is also within the scope of the present invention.

Figure 2:
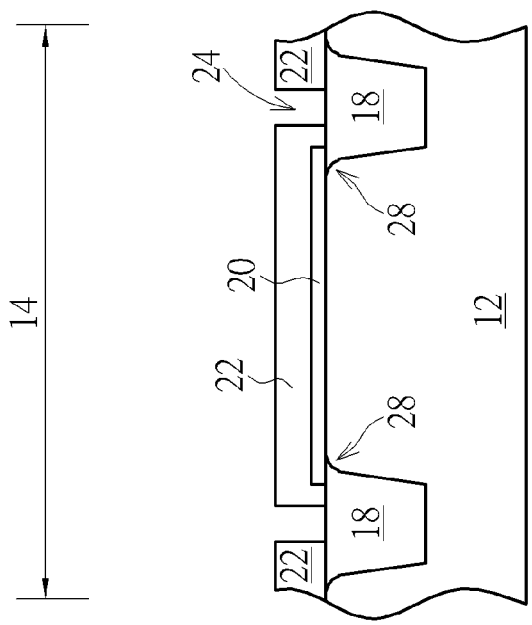
Figure 2:
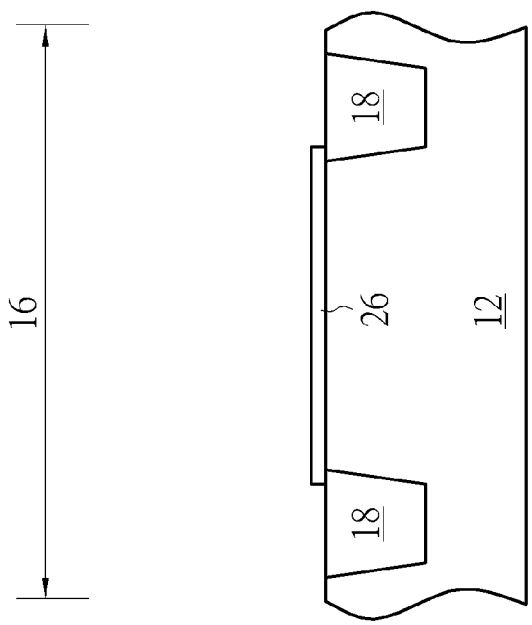

Next, as shown in FIGS. 1-2, a gas is driven-in or a treatment process such as oxidation is conducted to form a gate dielectric layer 26 on the second region 16 of the substrate 12 while altering an edge of the substrate 12 contacting the STI 18 on the first region 14. More specifically, since the second region 16 is not covered by the patterned hard mask 22, an oxygen-containing gas or oxygen gas itself was injected to react with the substrate 12 surface directly for forming a gate dielectric layer 26, in which the thickness of the gate dielectric layer 26 is preferably between 300 Angstroms to 1500 Angstroms and the gate dielectric layer 26 is preferably used for a HV semiconductor device formed afterwards.

Since the patterned hard mask 22 was disposed on the first region 14, the oxygen-containing gas was driven-in along the direction of the arrows shown in FIG. 1, such as entering from the opening 24 of the patterned hard mask 22 and through the STI 18 exposed by the opening 24 to alter an edge profile of the substrate 12 contacting the STI 18 or the edge profile of the STI 18 itself. According to a preferred embodiment of the present invention, the edges of the STI 18 or edges of the substrate 12 before injecting oxygen-containing gas were revealing profile having pronounced sharp angles. However, after introducing the oxygen-containing gas, the sharp angled edges of the STI 18 or substrate 12 were transformed into edges having curved profiles 28. Viewing from another perspective, as curved profiles were formed at the edges of the substrate 12, symmetrical protrusions are also formed at two sides of the STI 18 at the same time.

Figure 3:
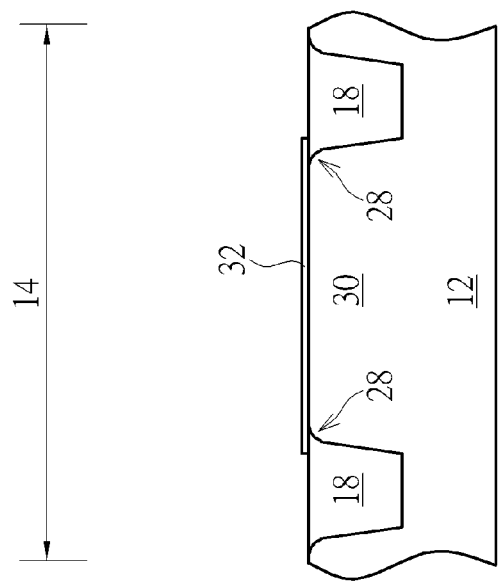
Figure 3:
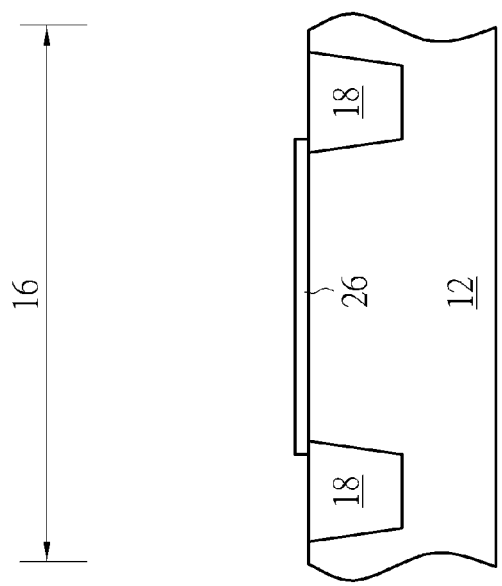

Next, as shown in FIG. 3, the patterned hard mask 22 is removed from the first region 14, and an ion implantation process is conducted to form a well 30 in the substrate 12 on first region 14.

Figure 4:
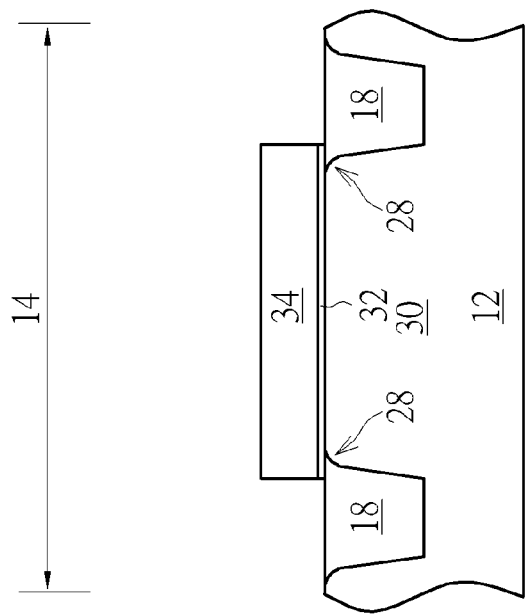
Figure 4:
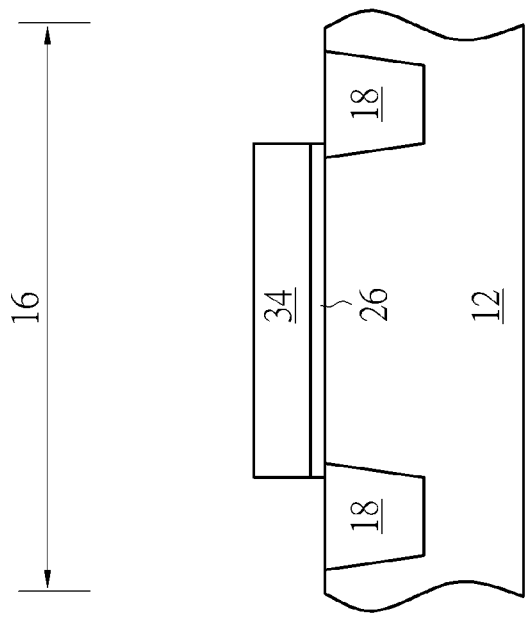

Next, as shown in FIG. 4, the pad layer 20 on the first region 14 is removed, and an oxidation process is conducted to form a gate dielectric layer 32 on the exposed substrate 12 surface on first region 14, in which the thickness of the gate dielectric layer 32 is preferably between 60 Angstroms to 200 Angstroms. The gate dielectric layer 32 will be serving as the gate dielectric layer of a mid-voltage device formed afterwards. Next, another gate dielectric layer (not shown) could be selectively formed on a low voltage region (not shown), and gate structures 34 are formed on the gate dielectric layers 32 and 26 on both first region 14 and second region 16, in which the gate structures 34 are preferably composed of polysilicon, but not limited thereto.

Figure 5:
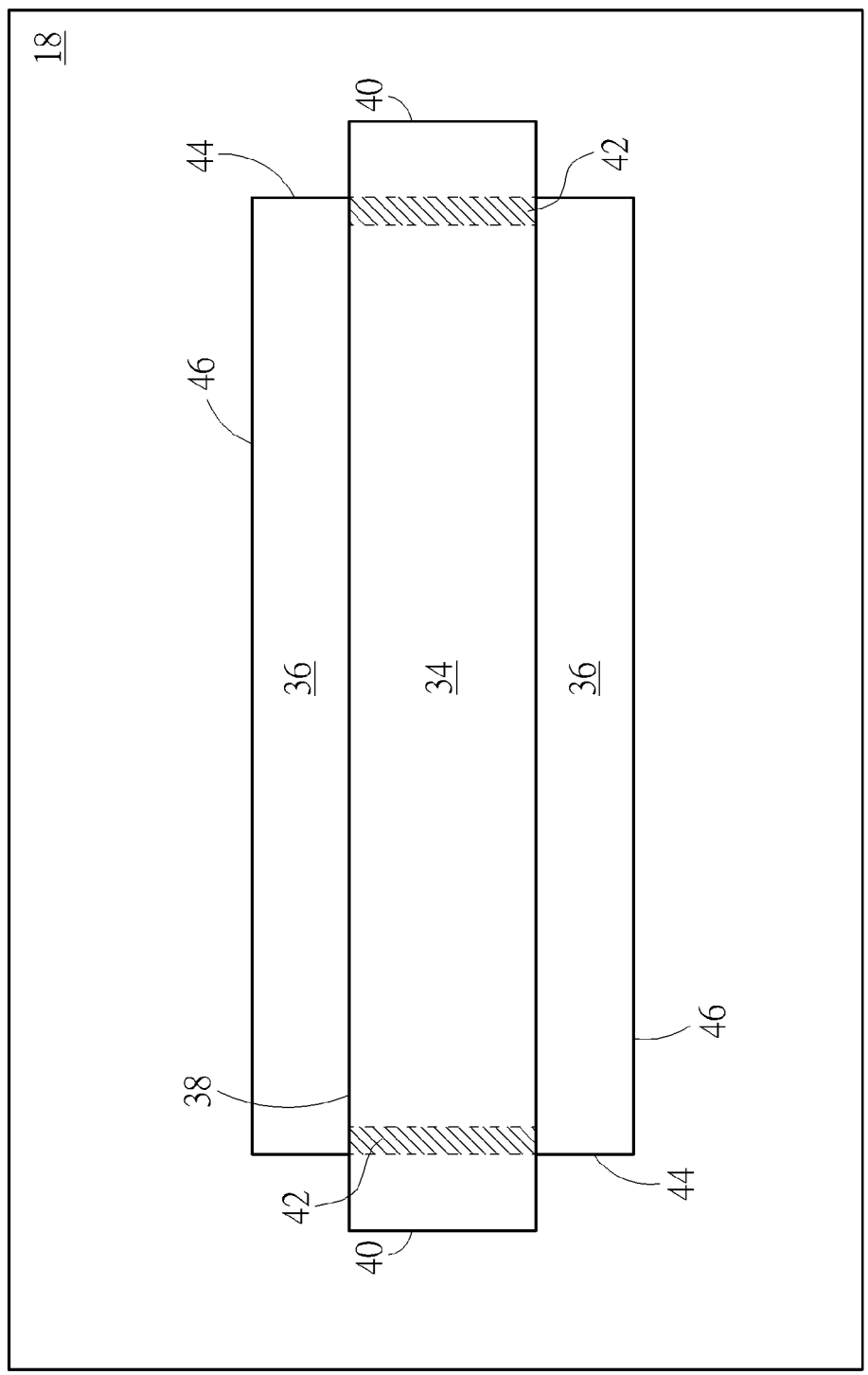

Referring now to FIG. 5, which illustrates a top view of the gate structure 34 formed on the first region 14. As shown in FIG. 5, it would then be desirable to conduct ion implantation processes to form diffusion regions 36 adjacent to two sides of the gate structure 34 for serving as source/drain region, in which the source/drain region could be having different conductive type depending on the type of device being fabricated.

Referring to FIGS. 4-5 at the same time, FIGS. 4-5 are structural views illustrating a semiconductor device according to a preferred embodiment of the present invention. As shown in FIGS. 4-5, the semiconductor device of the present invention includes a substrate 12, a gate structure 34 on the substrate 12, a diffusion region 36 adjacent two sides of the gate structure 34, and a STI 18 in the substrate 12 and surrounding the diffusion region 36 and gate structure 34, in which the edges of the substrate 12 contacting the STI 18 include curved profiles 28. Viewing from another perspective, the STI 18 under the gate structure 34 also includes corresponding protrusion symmetrically formed at two sides.

More specifically, as revealed in the top view diagram of FIG. 5, the gate structure 34 preferably includes a length 38 and a width 40, and the curved profiles 28 are formed directly under the gate structure 34 adjacent to and parallel to the width 40, such as the region 42 marked by slanted lines in FIG. 5. In other words, the openings 24 of the patterned hard mask 22 shown in FIGS. 1-2 only exposes part of the STI 18 adjacent to the edge of the width 40 of the gate structure 34.

In addition, the diffusion region 36 includes first sides 44 parallel to the width 40 of the gate structure 34 and second sides 46 parallel to the length 38 of the gate structure 34, the STI 18 is disposed to surround the first sides 44 and second sides 46 of the diffusion region 36, and the regions 42 of the curved profiles 38 are preferably under the gate structure 34 and adjacent to the first sides 44. If viewed from a detailed perspective, the regions 42 are preferably under the gate structure 34 and adjacent to a width 40 of the gate structure 34 that's aligned to the first sides 44 while not extending to the region directly under the diffusion region 36.

Figure 6:
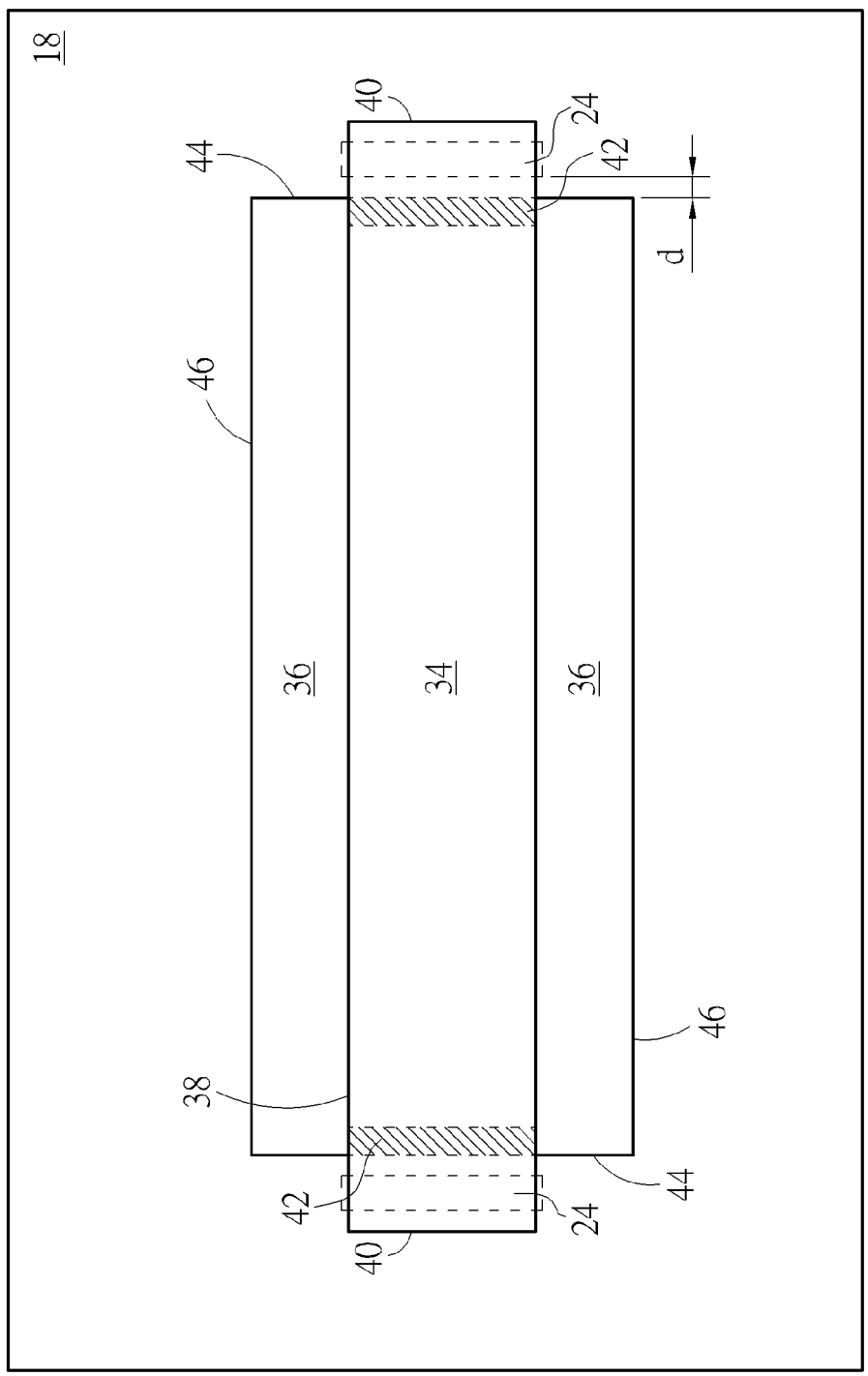
FIG. 6 illustrates a structural view of a semiconductor device according to an embodiment of the present invention.

Referring to FIG. 6, FIG. 6 is a top view diagram illustrating the top view structure from FIG. 5 in corresponding to the openings of the patterned hard mask shown in FIG. 2. As shown in FIG. 6, if compared with the openings 24 of the patterned hard mask 22 from FIG. 2, the edges of the openings 24 of the patterned hard mask 22 would preferably be not aligned to the first sides 44 of the diffusion region 36, and a distance d between the edge of the opening 24 to an edge or first side 44 of the diffusion region 36 is preferably between 0.005 μm to 0.5 μm, or most preferably at 0.02 μm.

Figure 7:
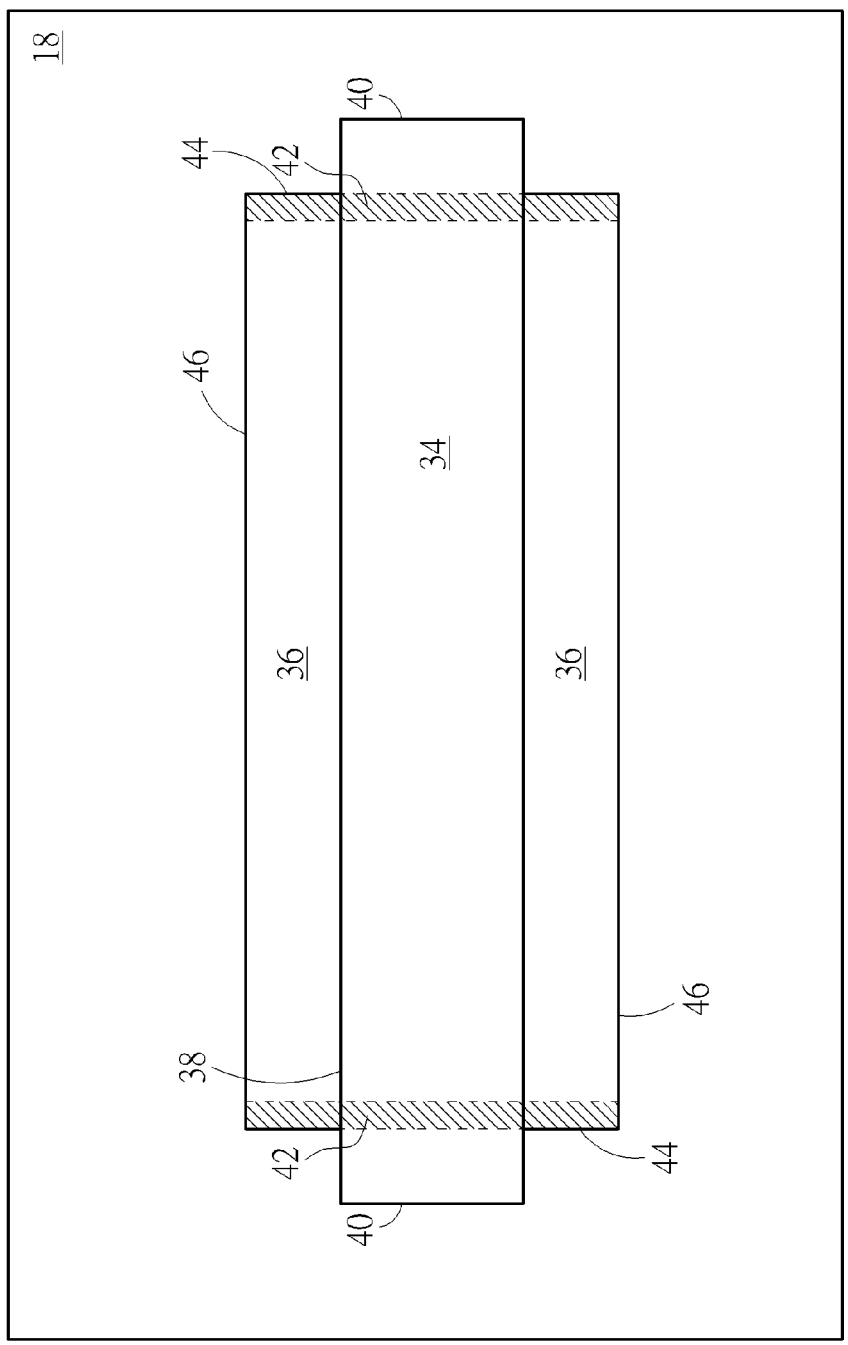
FIG. 7 illustrates a structural view of a semiconductor device according to an embodiment of the present invention.

Referring to FIG. 7, FIG. 7 illustrates a top view of a semiconductor device according to an embodiment of the present invention. As shown in FIG. 7, a gate structure 34 is formed on the substrate 12, a diffusion region 36 is formed adjacent to two sides of the gate structure 34, and a STI 18 is formed in the substrate 12 to surround the diffusion region 36 and the gate structure 34, in which the edge of the substrate 12 (parallel to the width 40 direction) contacting the STI 18 include curved profiles 28. That is, the openings 24 of the patterned hard mask 22 shown in FIGS. 1-2 preferably expose part of the STI 18 adjacent to the width 40 of the entire gate structure 34.

In contrast to the curved profiles 28 shown in FIG. 5, the regions 42 of the curved profiles 28 of this embodiment are formed not only under the gate structure 34 and adjacent to a width 40 aligned to the first sides 44 of the diffusion region 36, but also extending to the region directly under the diffusion region 36 and adjacent to the first sides 44 of the diffusion region 36.

Figure 8:
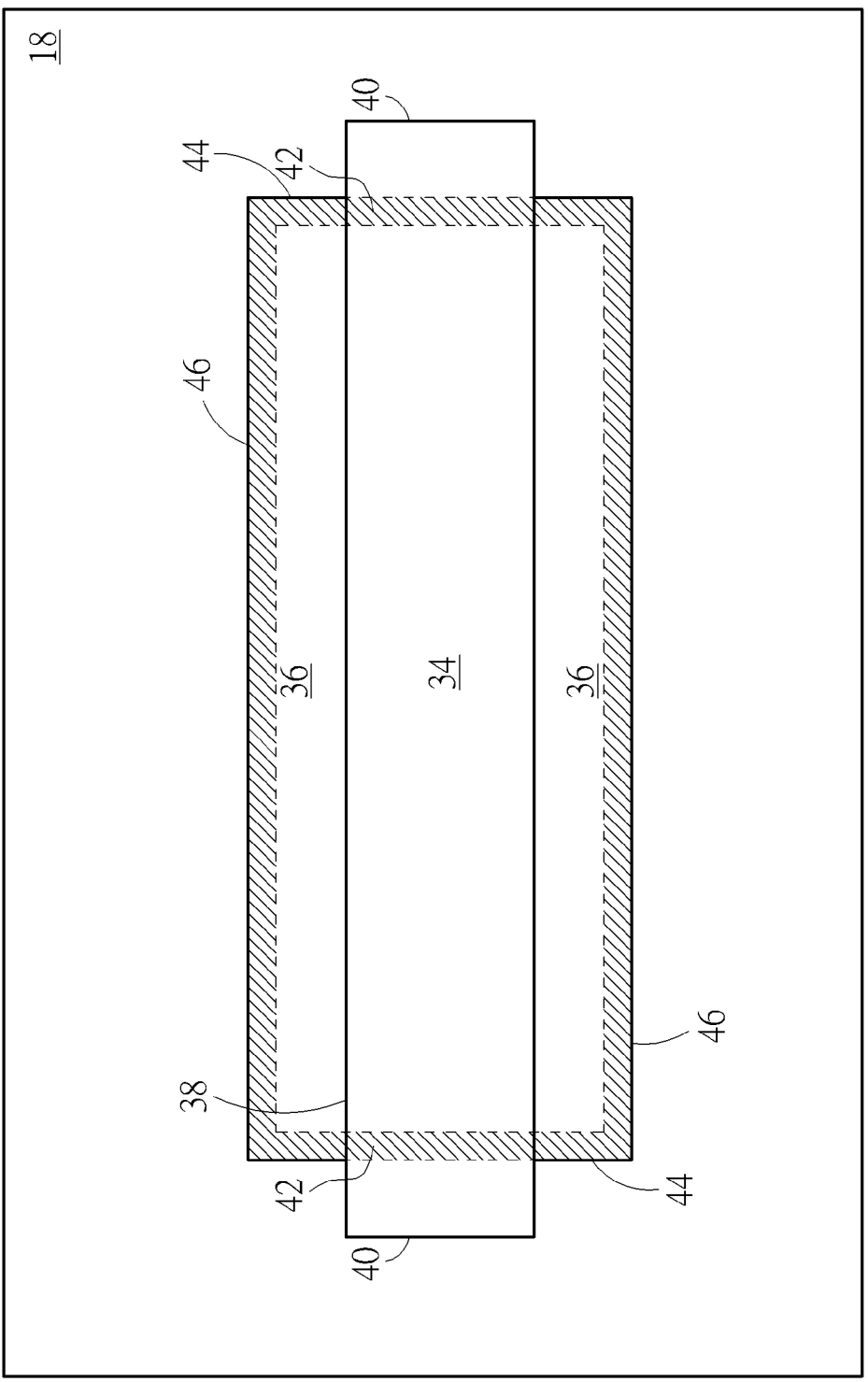
FIG. 8 illustrates a structural view of a semiconductor device according to an embodiment of the present invention.

Referring to FIG. 8, FIG. 8 illustrates a top view of a semiconductor device according to an embodiment of the present invention. As shown in FIG. 8, a gate structure 34 is formed on the substrate 12, a diffusion region 36 is formed adjacent to two sides of the gate structure 34, and a STI 18 is formed in the substrate 12 to surround the diffusion region 36 and the gate structure 34, in which the edges of the substrate 12 contacting the STI 18 include curved profiles 28. That is, the openings 24 of the patterned hard mask 22 shown in FIGS. 1-2 preferably expose all of the STI 18 contacting the edges of the substrate 12 on the first region 14.

In contrast to the aforementioned embodiments in FIGS. 5 and 7, the regions 42 of the curved profiles 28 of this embodiment is not only under the gate structure 34 and adjacent to the width 40 aligned to the first sides 44 of diffusion region 36, but also extending to the region under the diffusion region 36 and adjacent to the first sides 44 and second sides 46. In other words, the curved profiles 28 of the substrate 12 surround the entire diffusion region 36.

Overall, the present invention first forms a patterned hard mask on the substrate of a MV device region to cover the substrate and part of the STI, and then forms a gate dielectric layer on a HV device region and at the same time uses the oxygen-containing gas driven-in to alter the edge profile of the STI or the edge profile of the substrate contacting the STI on the MV device region. Since the HV device region is not covered by the aforementioned patterned hard mask, a gate dielectric layer would be formed on the surface of the substrate on HV device region. Due to the formation of the patterned hard mask, the oxygen-containing gas injected preferably enters from the openings of the patterned hard mask and through the STI to transform the originally sharp angled edge profile of the STI or substrate into a curved profile. This resulting curved profile could then be used to improve problem such as current leakage commonly found in today's STI design thereby improving the performance of the device substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first region and a second region;
   forming a shallow trench isolation (STI) in the substrate to separate the first region and the second region;
   forming a patterned hard mask on the first region and part of the STI, wherein the patterned hard mask comprises an opening to expose part of the STI; and
   driving-in a gas through the exposed STI to alter an edge of the substrate on the first region.

2. The method of claim 1, further comprising:
   providing the gas to form a first gate dielectric layer on the second region of the substrate while driving-in the gas to alter the edge of the substrate on the first region.

3. The method of claim 2, further comprising:
   removing the patterned hard mask after forming the first gate dielectric layer; and
   forming a well in the substrate of the first region.

4. The method of claim 3, further comprising:
   forming a pad layer and the patterned hard mask on the first region of the substrate and part of the STI;
   forming the first gate dielectric layer;
   removing the patterned hard mask;
   forming the well; and
   removing the pad layer.

5. The method of claim 4, further comprising forming a second gate dielectric layer on the first region of the substrate after removing the pad layer.

6. The method of claim 5, wherein a thickness of the first gate dielectric layer is greater than a thickness of the second gate dielectric layer.

7. The method of claim 5, further comprising:
   forming a gate structure on the second gate dielectric layer; and
   forming a diffusion region adjacent to two sides of the second gate dielectric layer.

8. The method of claim 5, wherein a distance between an edge of the opening to an edge of the diffusion region is between 0.005 μm to 0.5 μm.

9. The method of claim 1, wherein the gas comprises oxygen.

10. The method of claim 1, further comprising altering the edge of the substrate contacting the STI so that the edge comprises a curve.

* * * * *

UNITED STATES PATENT AND TRADEMARK OFFICE
CERTIFICATE OF CORRECTION

PATENT NO. : 9,653,343 B1  
APPLICATION NO. : 15/172136  
DATED : May 16, 2017  
INVENTOR(S) : Kai-Kuen Chang et al.

Page 1 of 1

It is certified that error appears in the above-identified patent and that said Letters Patent is hereby corrected as shown below:

On the Title Page

Item (73), correct the name of the assignee from "UNITED MOCIROELECTRONICS CORP." to --UNITED MICROELECTRONICS CORP.--.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*